(12) United States Patent
Okayasu

(10) Patent No.: US 6,268,757 B1
(45) Date of Patent: Jul. 31, 2001

(54) SEMICONDUCTOR DEVICE HAVING CAPACITOR THAT REDUCE FLUCTUATION OF POWER SUPPLY

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/431,094

(22) Filed: Nov. 1, 1999

(30) Foreign Application Priority Data

Mar. 30, 1999 (JP) .................................................. 11-087769

(51) Int. Cl.[7] ........................... H03K 17/16; H03K 17/30
(52) U.S. Cl. ............................................. 327/382; 327/427
(58) Field of Search ..................................... 327/379, 382, 327/383, 384, 390, 394, 399, 427, 534, 535, 537, 541; 326/33, 34, 47

(56) References Cited

U.S. PATENT DOCUMENTS

| 4,908,528 | 3/1990 | Huang ..................................... 326/33 |
| 4,982,120 | 1/1991 | Longwell et al. .................... 327/427 |
| 5,317,206 | 5/1994 | Hanibuchi et al. ..................... 326/62 |
| 5,825,217 | * 10/1998 | Lehavot ................................ 327/111 |
| 5,841,299 | * 11/1998 | De ........................................... 326/98 |
| 5,900,766 | * 5/1999 | Naffziger et al. ..................... 327/382 |
| 6,100,751 | * 8/2000 | De et al. ............................... 327/534 |

* cited by examiner

*Primary Examiner*—My-Trang Nu Ton
(74) *Attorney, Agent, or Firm*—Pillsbury Winthrop LLP

(57) ABSTRACT

A semiconductor device driven by two power source voltages VDD and VSS (VDD>VSS) comprising a base, and an FET provided on the base. The FET has a gate, a source, a drain, and a substrate; and the gate is connected to one of the two power source voltages VDD and VSS, and at least one of the source, the drain, or the substrate is connected to another of the two power source voltages VDD and VSS. A capacity coupling is formed between the power source voltage VDD and the power source voltage VSS by a capacitance generated between the gate and at least one of the source, the drain, and the substrate.

18 Claims, 16 Drawing Sheets

(A)

(B)

SEMICONDUCTOR DEVICE HAVING CAPACITOR THAT REDUCE FLUCTUATION OF POWER SUPPLY

This patent application claims priority based on a Japanese patent application, H11-087769 filed on Mar. 30, 1999, the contents of which are incorporated herein by reference.

BACKGROUND OF THE INVENTION

1. Field of Invention

The present invention relates to a semiconductor device. In particular, the present invention relates to a semiconductor device which forms a capacity coupling between a power source voltage VDD and a power source voltage VSS by an FET provided inside a gate array.

2. Description of Related Art

FIG. 1 shows a conventional gate array GA. A plurality of gates is arranged all over the gate array GA shown in FIG. 1(A). As shown in FIG. 1(B), a basic cell BC is arranged at regular intervals covering the region where the gates are arranged. As shown in FIG. 1(c), the basic cell usually has either four or eight FET. The desired circuit can be obtained by connecting the FET inside the basic cell BC by an aluminum wire.

FIG. 2 shows conventional inverters INV10 and INV12, and also shows the current, which flows between the inverter INV10 and the inverter INV12. The inverter INV10 and the inverter INV 12 are formed by the FET inside the basic cell BC. A signal line LIN connects the inverter INV10 and the inverter INV12. As shown in FIG. 2(A), when the voltage Vout, which is a voltage output from inverter INV10, inverts from a Low signal to High signal, a power source current Ih flows from the power source voltage VDD to the signal line LIN. A wiring capacitance CL is generated in the signal line LIN, so that a part of the power source current Ih is consumed in charging the wiring capacitance CL. A pass-through current Ihl flows in the inverter INV10 from the power source voltage VDD to the power source voltage VSS.

As shown in FIG. 2(B), when the voltage Vout, which is a voltage output from the inverter INV10, inverts from a High signal to Low signal, a pass-through current Ihl flows in the inverter INV10 from the power source voltage VDD to the power source voltage VSS. Because the electric charge, which is charged in the wiring capacitance CL, discharges, a power source current Il flows from the wiring capacitance CL to the power source voltage VSS of the inverter INV10.

FIG. 3 shows the waveform of the voltage input or output from the inverter INV10. FIG. 3(A) shows the waveform of the voltage Vin, which is the voltage input to the inverter INV10.

FIG. 3(B) shows the waveform of the voltage Vout, which is the voltage output from the inverter INV10. FIG. 3(C) shows the waveform of the voltage VDD-VSS, which is the voltage obtained by subtracting the power source voltage VSS from the power source voltage VDD. As shown ain A of FIG. 3(A), if the voltage Vin inverts from a Low signal to High signal, the voltage Vout inverts from a High signal to Low signal as shown in A of FIG. 3(B).

When the electric charge, charged in the wiring capacitance CL of the signal line LIN, discharges, the power source current Il flows from the wiring capacitance CL to the power source voltage VSS of the inverter INV10. Because the electric charge, which is charged in the wiring capacitance CL, is discharged to the power source voltage VSS, the voltage VDD-VSS decreases for a moment as shown in A of FIG. 3(C). Therefore, the decrease of the voltage Vout, which is output from the inverter INV10, is delayed.

Moreover, as shown in B of FIG. 3(A), if the voltage Vin inverts from a High signal to Low signal, the voltage Vout inverts from a Low signal to High signal as shown in B of FIG. 3(B). The power source current Ih flows from the power source voltage VDD of the inverter INV10 to the signal line LIN. Because the wiring capacitance CL is generated in the signal line LIN, the power source current Ih is consumed for charging the wiring capacitance CL. The wiring capacitance CL consumes the power source current Ih, so the voltage VDD-VSS decreases for a moment as shown in B of FIG. 3(C). Therefore, the increase of the voltage Vout delays as shown in FIG. 3(B). The timing of which of the circuits inside a gate array operates lags by the fluctuation of the power source voltage VDD and VSS generated by the charging and discharging of the wiring capacitance CL. The result is, a decrease in the accuracy of the timing of the operation.

SUMMARY OF THE INVENTION

As stated, it is an object of the present invention to provide a semiconductor device that can solve the problems outlined above. The object of the present invention can be achieved by the combinations of features described in the independent claims of the present invention. The dependent claims define further advantageous embodiments of the present invention.

According to the first aspect of the present invention, a semiconductor device driven by two power source voltages VDD and VSS (VDD>VSS) can be provided. The semiconductor device comprises a base and a FET provided on the base. The FET has a gate, a source, a drain, and a substrate. The gate is connected to one of the two power source voltages VDD and VSS, and at least one of the source, the drain, or the substrate is connected to another one of the two power source voltages VDD and VSS. A capacity coupling is formed between the power source voltage VDD and the power source voltage VSS by a capacitance realized between the gate and at least one of the source, the drain, and the substrate.

A semiconductor device can be provided which further comprises a main power bus provided at least on the periphery of the semiconductor device. The main power bus provides the two power source voltages VDD and VSS to the FET. The FET is provided between the base and the main power bus, and a capacity coupling is formed by the FET between the power source voltage VDD and the power source voltage VSS of the main power bus.

A semiconductor device can be provided such that the FET is an N-type FET. The power source voltage VDD is applied to the drain and the source of the N-type FET, and the power source voltage VSS is applied to the gate and the substrate of the N-type FET.

A semiconductor device can be provided such that the FET is a P-type FET. The power source voltage VSS is applied to the drain and the source of the P-type FET, and the power source voltage VDD is applied to the gate and the substrate of the P-type FET.

A semiconductor device can be provided such that the FET is a N-type FET. The power source voltage VSS is applied to the drain, the source, and the substrate of the N-type FET, and the power source voltage VDD is applied to the gate of the N-type FET.

A semiconductor device can be provided such that the FET is a P-type FET. The power source voltage VDD is applied to the drain, the source, and the substrate of the P-type FET, and the power source voltage VSS is applied to the gate of the P-type FET.

A semiconductor device can be provided such that the FET is a N-type FET. The power source voltage VDD is applied to the drain, the source, and the gate of the N-type FET, and the power source voltage VSS is applied to the substrate of the N-type FET.

A semiconductor device can be provided such that the FET is a P-type FET. The power source voltage VSS is applied to the drain, the source, and the gate of the P-type FET, and the power source voltage VDD is applied to the substrate of the P-type FET.

A semiconductor device can be provided such that the FET is a P-type FET. The power source voltage VDD is applied to the gate of the P-type FET, and at least one of the drain and the source of the P-type FET is connected to the gate. Another one of the drain and the source is connected to the power source voltage VSS.

A semiconductor device can be provided such that the FET is a N-type FET. The power source voltage VSS is applied to the gate of the N-type FET, and at least one of the drain and the source of the N-type FET is connected to the gate. Another one of the drain and the source is connected to the power source voltage VDD.

A semiconductor device can be provided such that the FET is a P-type FET, and one of the power source voltage VDD and the power source voltage VSS is applied to the gate of the P-type FET. Another one of the power source voltage VDD and the power source voltage VSS is applied to the drain and the source of the P-type FET.

A semiconductor device can be provided such that the FET is a N-type FET, and one of the power source voltage VDD and the power source voltage VSS is applied to the gate of the N-type FET. Another one of the power source voltage VDD and the power source voltage VSS is applied to the drain and the source of the N-type FET.

A semiconductor device can be provided such that the semiconductor device is a gate array, which has a plurality of arranged FET. The capacity coupling is formed by the FET of the gate array.

A semiconductor device can be provided which further comprises an analog circuit unit driven by the two power source voltages VDD and VSS (VDD>VSS), and a digital circuit unit driven by the two power source voltages VDD and VSS (VDD>VSS). The FET is provided between the analog circuit unit and the digital circuit unit. Furthermore, at least one of the analog circuit unit and the digital circuit unit may have the FET.

A semiconductor device can be provided which further comprises an input circuit which inputs a signal from outside the semiconductor device, and an output circuit which outputs a signal from the semiconductor device. At least one of the FET is provided beside the input circuit, and another of the FET is provided beside the output circuit.

A semiconductor device can be provided which further comprises a plurality of delay devices which delay an input signal, the delay devices being driven by the two power source voltages VDD and VSS (VDD>VSS). The semiconductor device also comprises a plurality of FET, each of which is arranged beside each of the different delay devices. The capacity coupling is formed between the power source voltage VDD and the power source voltage VSS by each of the plurality of the FET.

DETAILED DESCRIPTION OF THE INVENTION

The present invention will be explained using embodiments of the present invention. The following embodiments however, do not limit the scope of the present invention described in the claims. Moreover, not all the features or their combinations described in the embodiments are necessarily essential for the present invention.

Figure 1:
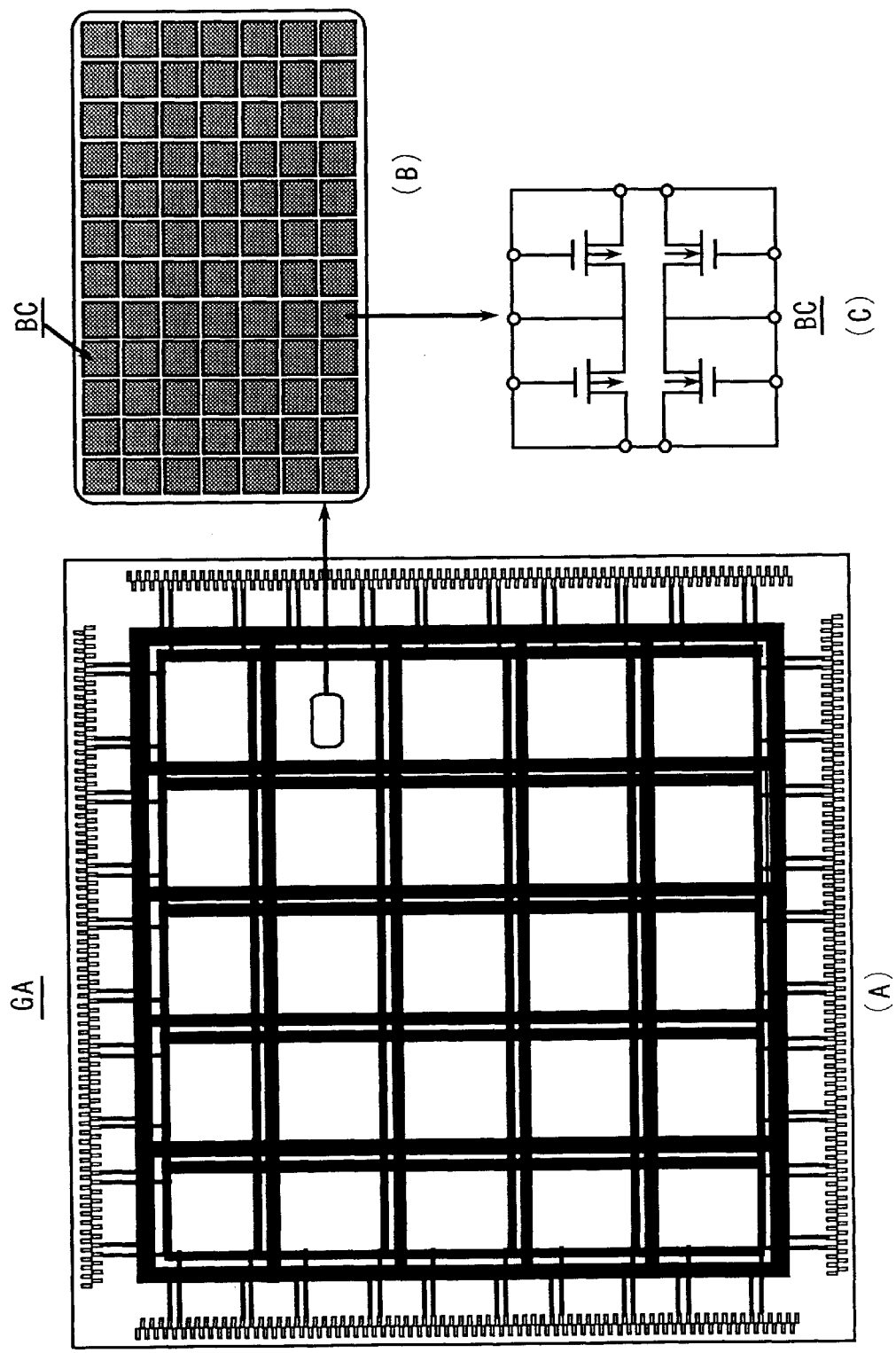
FIG. 1 shows a conventional gate array GA.
Figure 2:
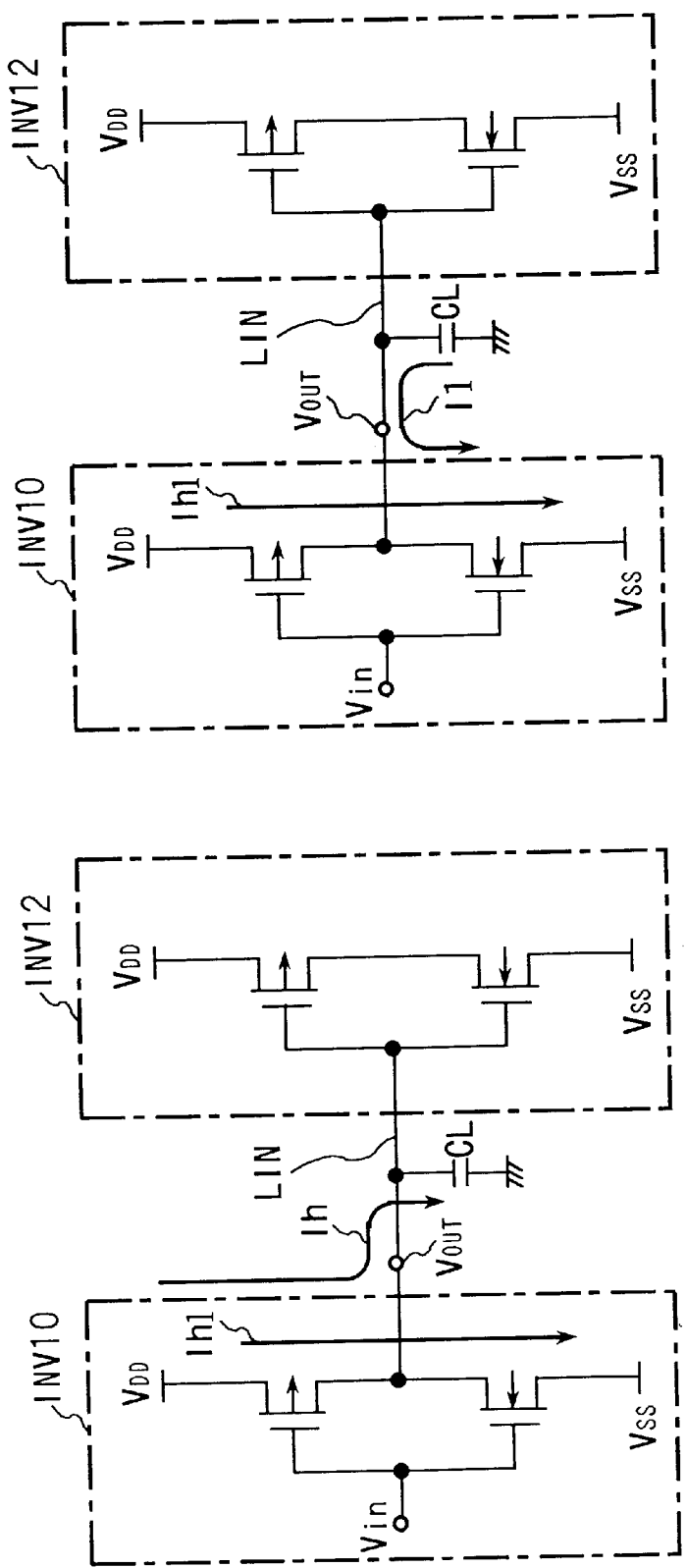
FIG. 2 shows conventional inverters INV10 and INV12, and also shows the current, which flows between the inverter INV10 and the inverter INV12.
Figure 3:
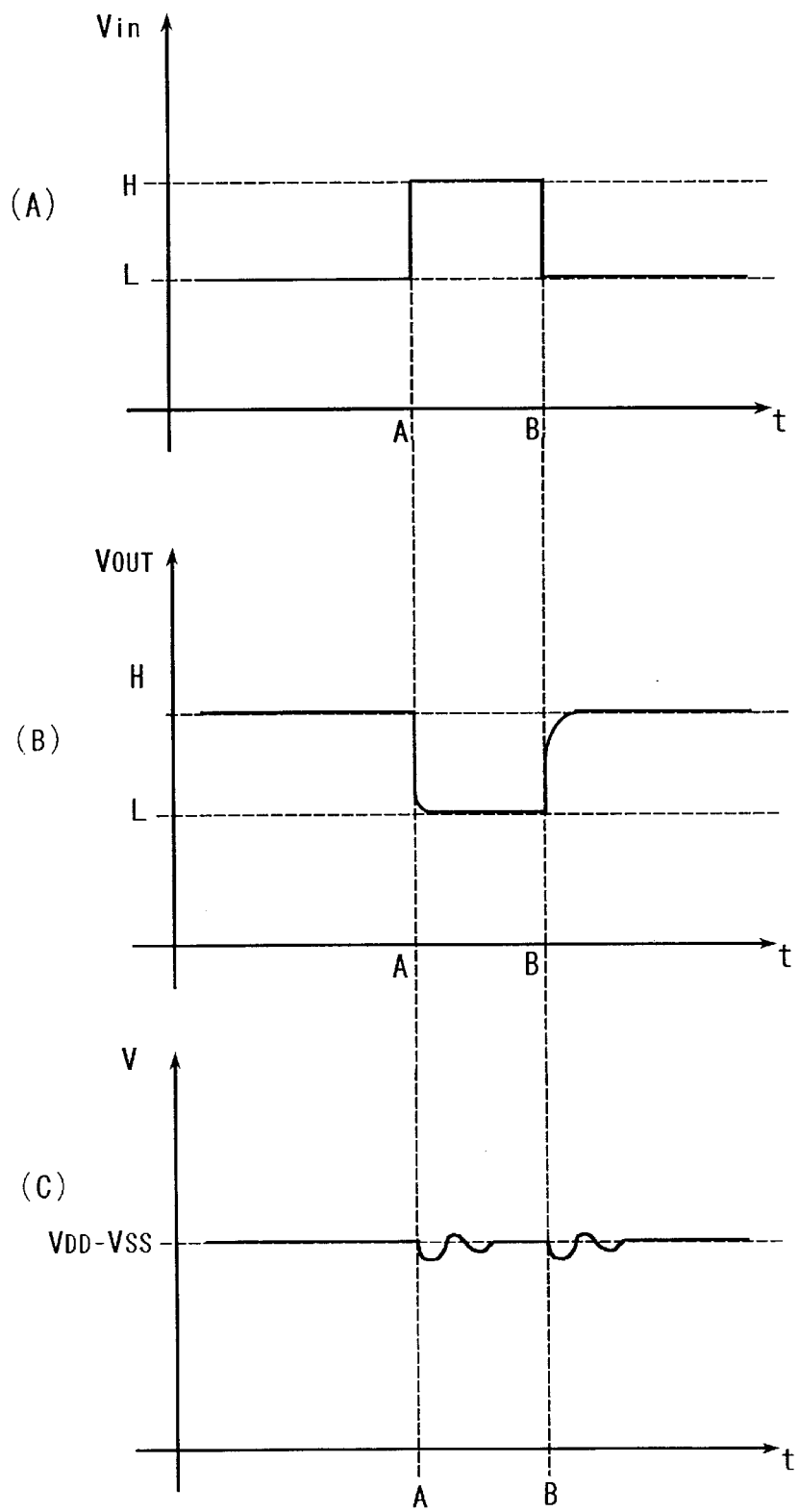
FIG. 3 shows the waveform of voltage, which is input or output from the inverter INV10.
Figure 4:
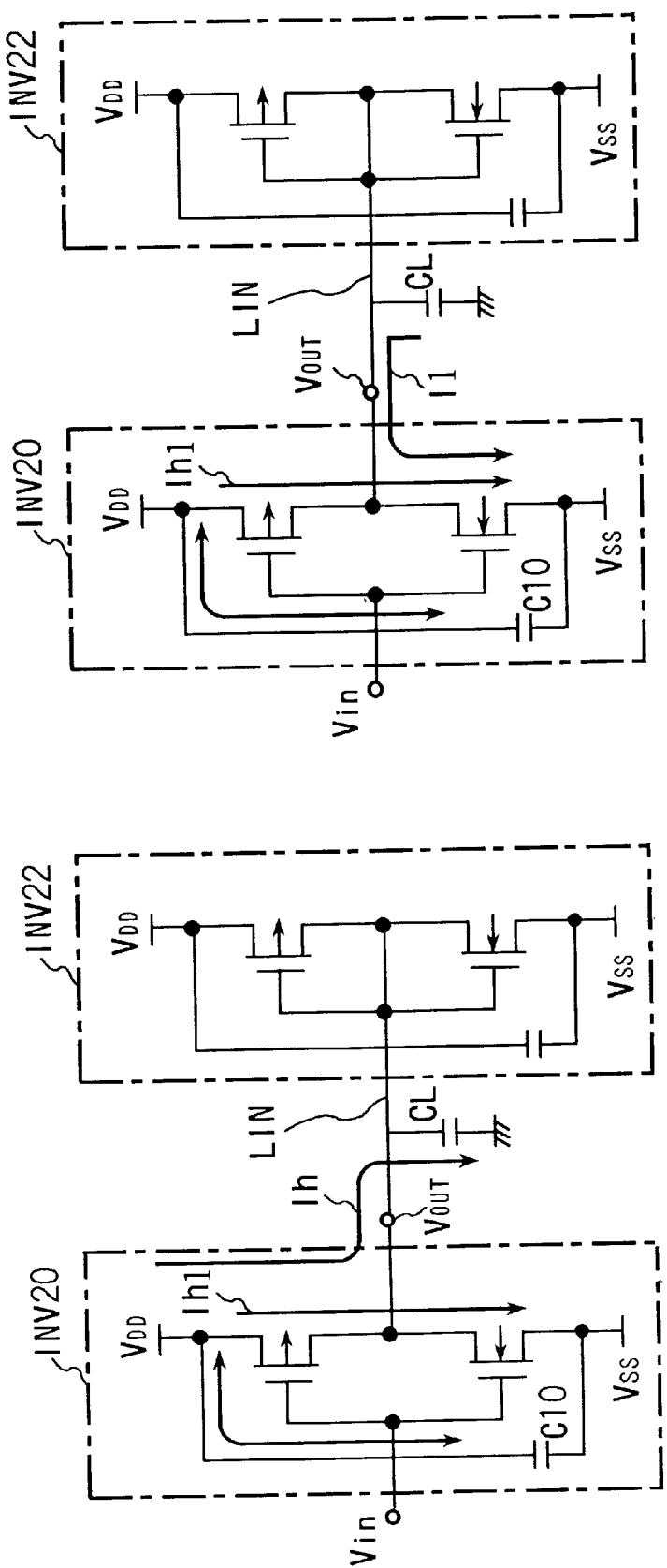
FIG. 4 shows inverters INV20 and INV22 of the present invention, and also shows the current, which flows between the inverter INV20 and the inverter INV22.

FIG. 4 shows inverters INV20 and INV22 of the present invention, and also shows the current, which flows between the inverter INV20 and the inverter INV22. The inverter INV20 and inverter INV 22 consist of FET inside the basic cell BC. A signal line LIN connects the inverter INV20 and inverter INV22. A condenser C10 connects the power source voltage VDD and the power source voltage VSS of the inverter INV20. In the same way, the condenser C10 connects the power source voltage VDD and the power source voltage VSS of the inverter INV22. The FET inside the basic cell BC forms the condenser C10.

As shown in FIG. 4(A), when the voltage Vout, which is a voltage output from inverter INV20, inverts from a Low signal to High signal, the pass-through current Ihl flows in the inverter INV20 from the power source voltage VDD to the power source voltage VSS. Moreover, the power source current Ih flows from the power source voltage VDD of the inverter INV20 to the signal line LIN. Because the wiring capacitance CL occurs in the signal line LIN, a part of the power source current Ih is consumed in charging the wiring capacitance CL. The electric charge which is charged in the condenser C10, is then discharged. The power source voltage VDD, which is reduced by charging the wiring capacitance CL, is supplemented with the electric charge discharged from the condenser C10. Thus a decrease the fluctuation of the power source voltage VDD and power source voltage VSS is achieved.

As shown in FIG. 4(B), when the voltage Vout inverts from a High signal to Low signal, the pass-through current Ihl flows in the inverter INV20 from the power source voltage VDD to the power source voltage VSS. Because the electric charge, which is charged in the wiring capacitance CL, is discharged, a power source current Il flows from the wiring capacitance CL to the power source voltage VSS of the inverter INV20. The condenser C10 then charges the electric charge of the power source current Il to reduce the power source current Il, and thus decrease the fluctuation of the power source voltage VDD and the power source voltage VSS.

Figure 5:
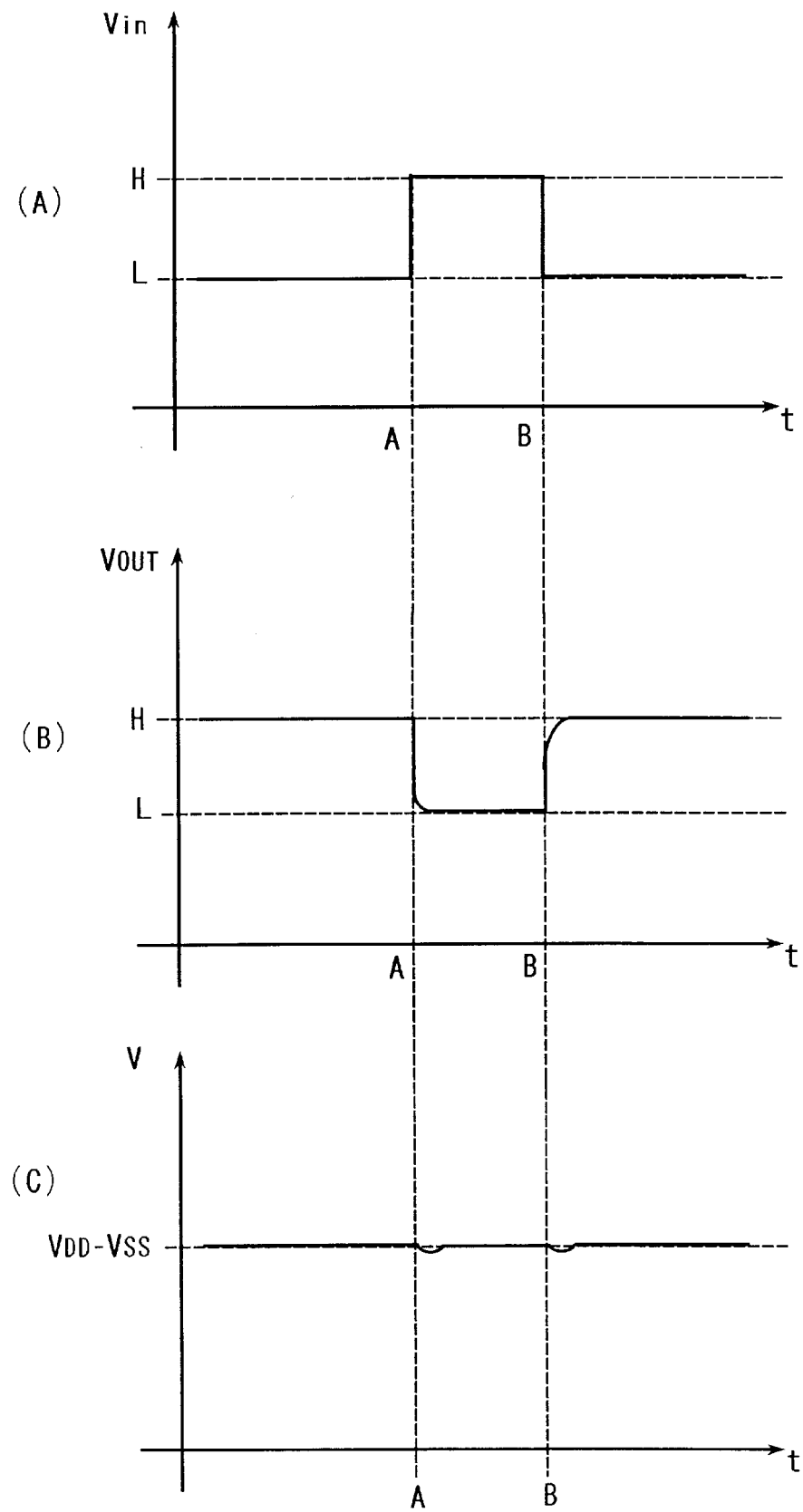
FIG. 5 shows the waveform of voltage, which is input or output from the inverter INV20.

FIG. 5 shows the waveform of voltage input or output from the inverter INV20. FIG. 5(A) shows the waveform of the voltage Vin input to the inverter INV20. FIG. 5(B) shows the waveform of the voltage Vout output from the inverter INV20. FIG. 5(C) shows the waveform of the voltage VDD-VSS, which is the voltage obtained by subtracting the power source voltage VSS from the power source voltage VDD. As shown in A of FIG. 5(A), if the voltage Vin inverts from a Low signal to High signal, the voltage Vout inverts from a High signal to Low signal as shown in A of FIG. 5(B).

The electric charge, which is charged in the wiring capacitance CL of the signal line LIN, discharges, and the power source current Il flows from the wiring capacitance CL to the power source voltage VSS of the inverter INV20. The condenser C10 then charges the electric charge of the power source current Il to reduce the change of power source current Il. Therefore, the fluctuation of the voltage VDD-VSS is smaller than in the conventional inverters INV10 and INV12 as shown in A of FIG. 5(C).

As shown in B of FIG. 5(A), if the voltage Vin inverts from a High signal to Low signal, the voltage Vout inverts from a Low signal to High signal as shown in B of FIG. 5(B). The power source current Ih flows from the power source voltage VDD of the inverter INV20 to the signal line LIN. Because the wiring capacitance CL occurs in the signal line LIN, the power source current Ih is consumed in charging the wiring capacitance CL. The condenser C10 then discharges the electric charge, which is charged in the condenser C10, to reduce the drop of the power source voltage VDD and VSS. Therefore, the fluctuation of the voltage VDD-VSS is smaller than in the conventional inverters INV10 and INV12 as shown in B of FIG. 5(C).

As shown above, the fluctuation of the power source voltage VDD and the power source voltage VSS can be decreased by connecting the power source voltage VDD and the power source voltage VSS of the inverter INV20 by the condenser C10. The condenser C10 supplements the current consumed by charging and discharging the wiring capacitance CL, with the electric charge charged in the condenser C10 itself. Therefore, the fluctuation of the power source voltage VDD and the power source voltage VSS of the basic cell BC is reduced by forming the condenser ClO using the FET inside the basic cell BC.

The accuracy of the timing of operation of the basic cell BC is then improved. Furthermore, the fluctuation of the power source voltage VDD and the power source voltage VSS of the gate array GA decreases when the gate array GA uses the basic cell BC which has the condenser C10. The accuracy of the timing of the operation of the gate array GA then improves.

Figure 6:
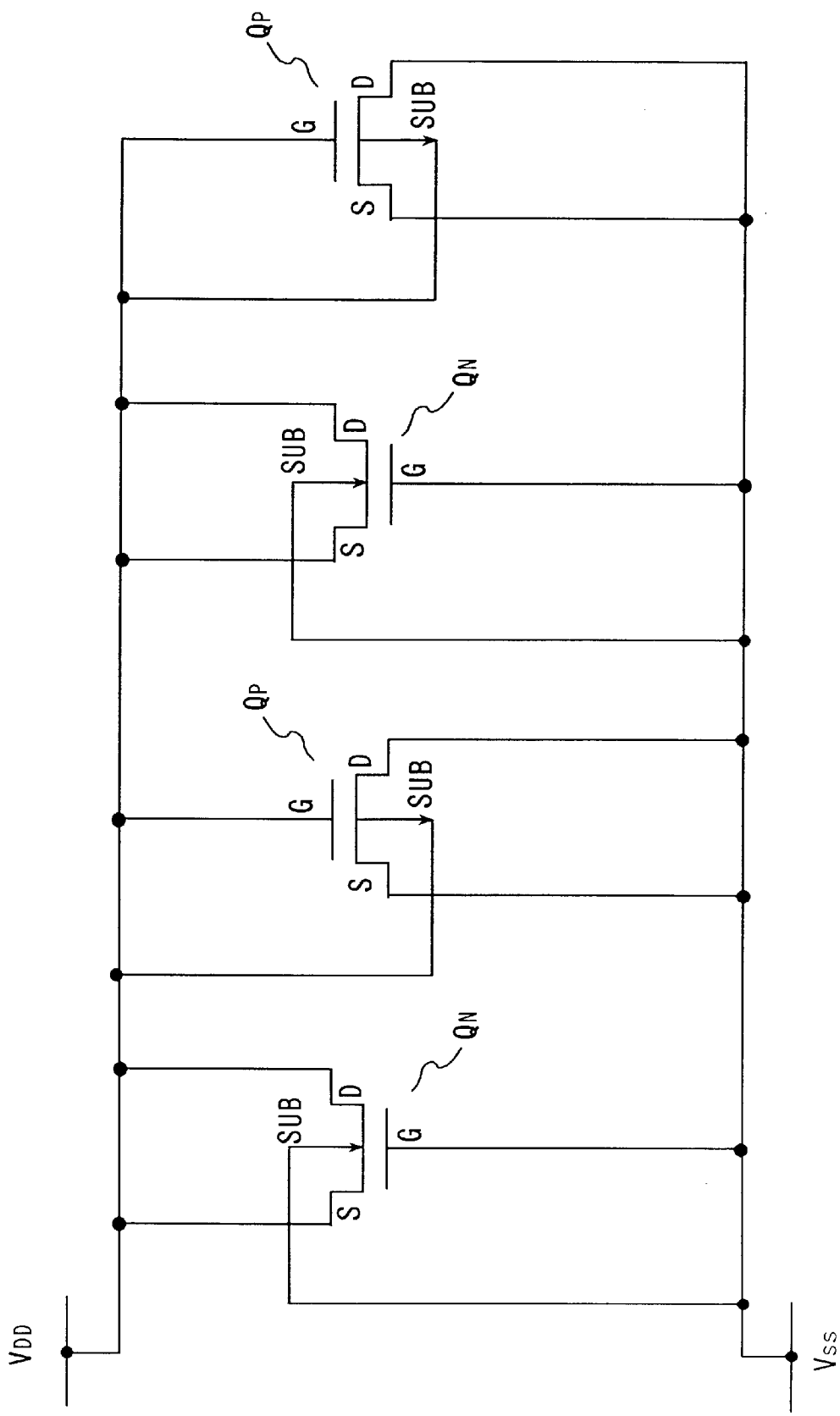
FIG. 6 shows an example of the circuit of the condenser C10.

FIG. 6 shows an example of the circuit of the condenser C10. The capacitor C10 has a plurality of P-type FET $Q_P$ and a plurality of N-type FET $Q_N$. The power source voltage VDD is applied to a drain D and source S. The power source voltage VSS is applied to a gate G and a substrate SUB of the N-type FET $Q_N$ of the condenser C10. The power source voltage VSS is applied to a drain D and source S, and the power source voltage VDD is applied to a gate G and a substrate SUB of the P-type FET $Q_P$ of the condenser C10.

Figure 7:
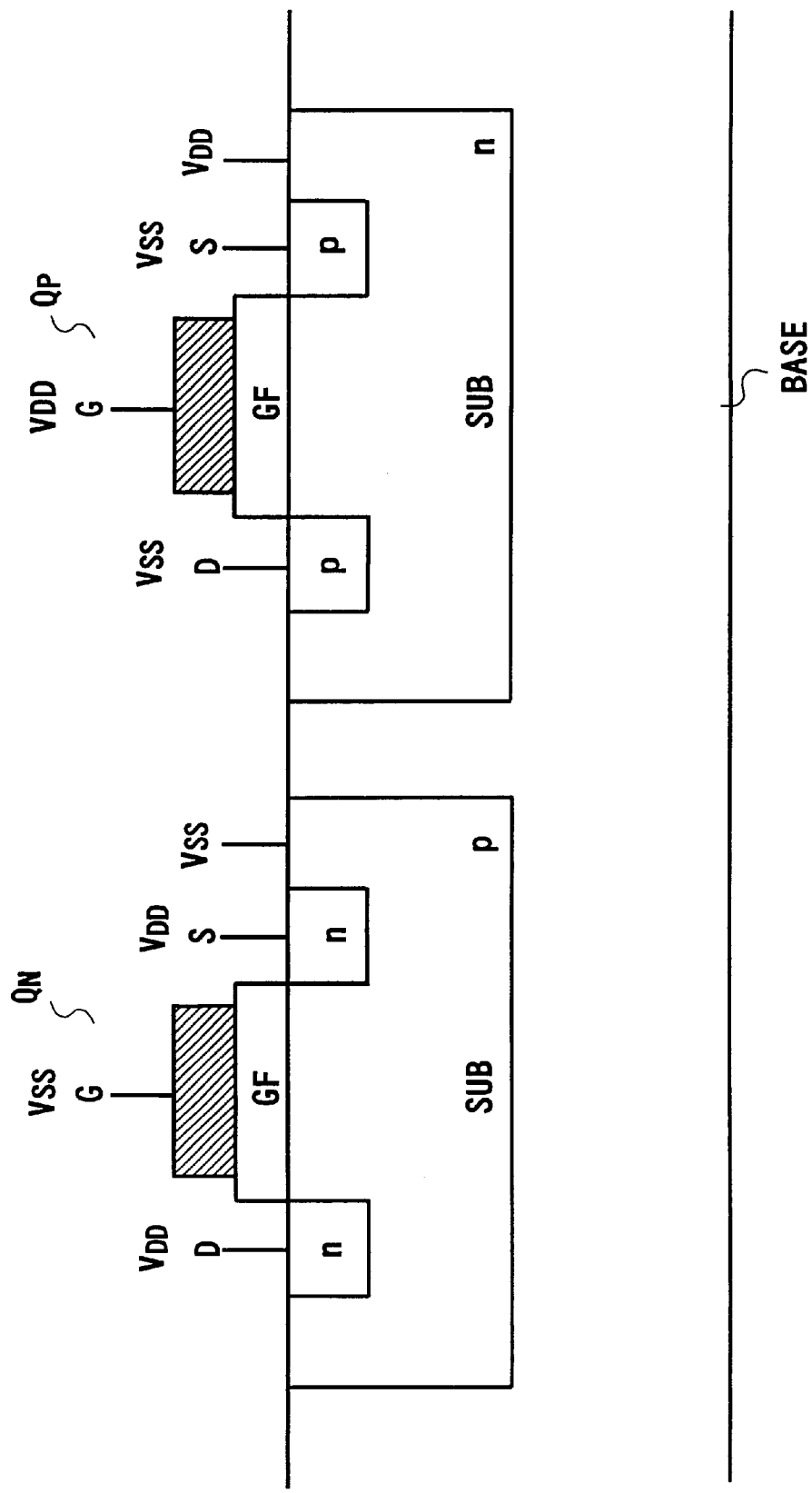
FIG. 7 shows a cross sectional view of the structure of the condenser C10 shown in FIG. 6.

FIG. 7 shows a cross sectional view of the structure of the condenser C10 shown in FIG. 6. The P-type FET $Q_P$ and the N-type FET $Q_N$ are provided on a base. The gate G of the N-type FET $Q_N$ is insulated from the substrate SUB and the channel by a gate oxidation film GF. Because the gate oxidation film GF is an insulator, the condenser C10 can be formed by the FET. The gate G of the P-type FET $Q_P$ is insulated from the substrate SUB and the channel by a gate oxidation film GF. Because the gate oxidation film GF is an insulator, the condenser C10 can be formed by the FET.

Figure 8:
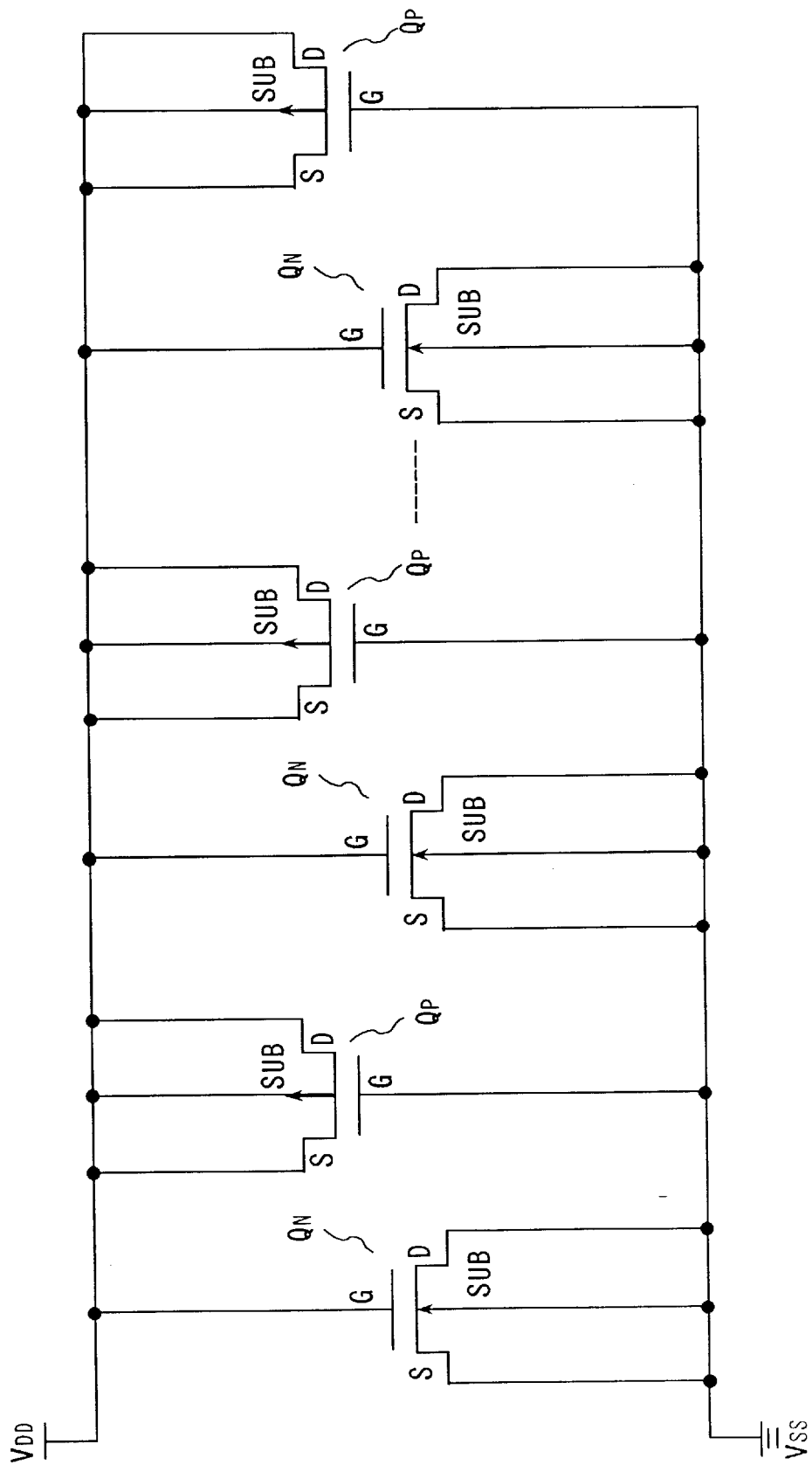
FIG. 8 shows another example of the circuit of the condenser C10.

FIG. 8 shows another example of the circuit of the condenser C10. The condenser C10 has a plurality of P-type FET $Q_P$ and a plurality of N-type FET $Q_N$. The power source voltage VSS is applied to the drain D, the source S, and the substrate SUB, and the power source voltage VDD is applied to the gate G of the N-type FET $Q_N$ of the condenser C10. The power source voltage VDD is applied to the drain D, the source S, and the substrate SUB, and the power source voltage VSS is applied to the gate G of the P-type FET $Q_P$ of the condenser C10.

Figure 9:
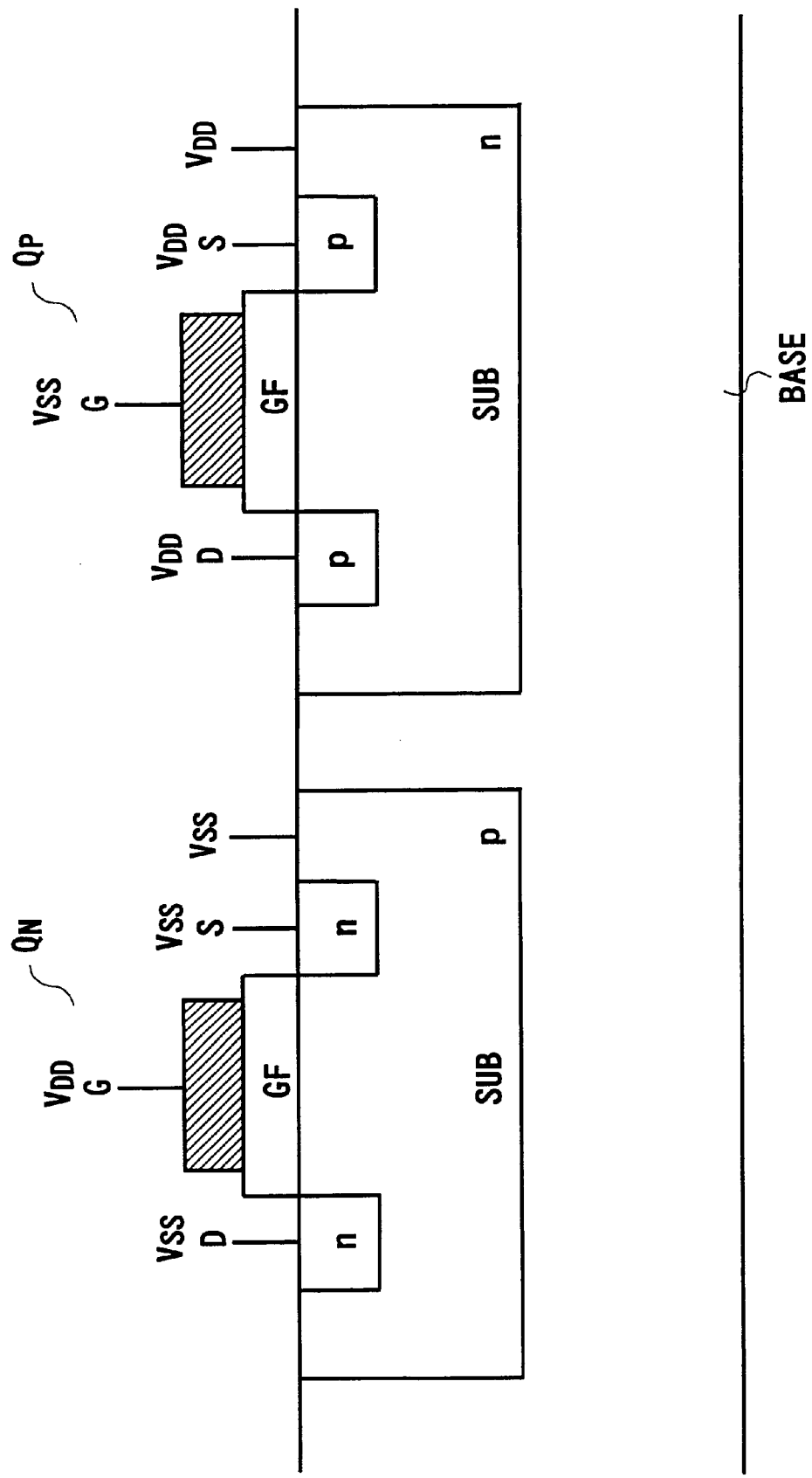
FIG. 9 shows a cross sectional view of the structure of the condenser C10 shown in FIG. 8.

FIG. 9 shows a cross sectional view of the structure of the condenser C10 shown in FIG. 8. The power source voltage VDD, which has a forward bias to the N-type FET $Q_N$, is applied to the gate G of the N-type FET $Q_N$ of the condenser C10. Because the same power source voltage VSS is applied to the source S and the drain D, a current does not flow from the source S to the drain D. The same power source voltage VSS, which is an opposite power source voltage to that of the gate G, is applied to the substrate SUB. A depletion layer is generated on the surface of the substrate SUB where contact occurs with the gate oxidation film GF. Because this depletion layer functions as an insulator, the condenser C10 can be formed by the FET.

The power source voltage VSS, which has a forward bias to the P-type FET $Q_P$, is applied to the gate G of the P-type FET $Q_P$ of the condenser C10. Because the same power source voltage VDD is applied to the source S and the drain D, current does not flow from the source S to the drain D. The same power source voltage VDD, which is an opposite power source voltage to that of the gate G, is applied to the substrate SUB. A depletion layer is generated on the surface of the substrate SUB where contact occurs with the gate oxidation film GF. Because this depletion layer functions as an insulator, the condenser C10 can be formed by the FET.

Figure 10:
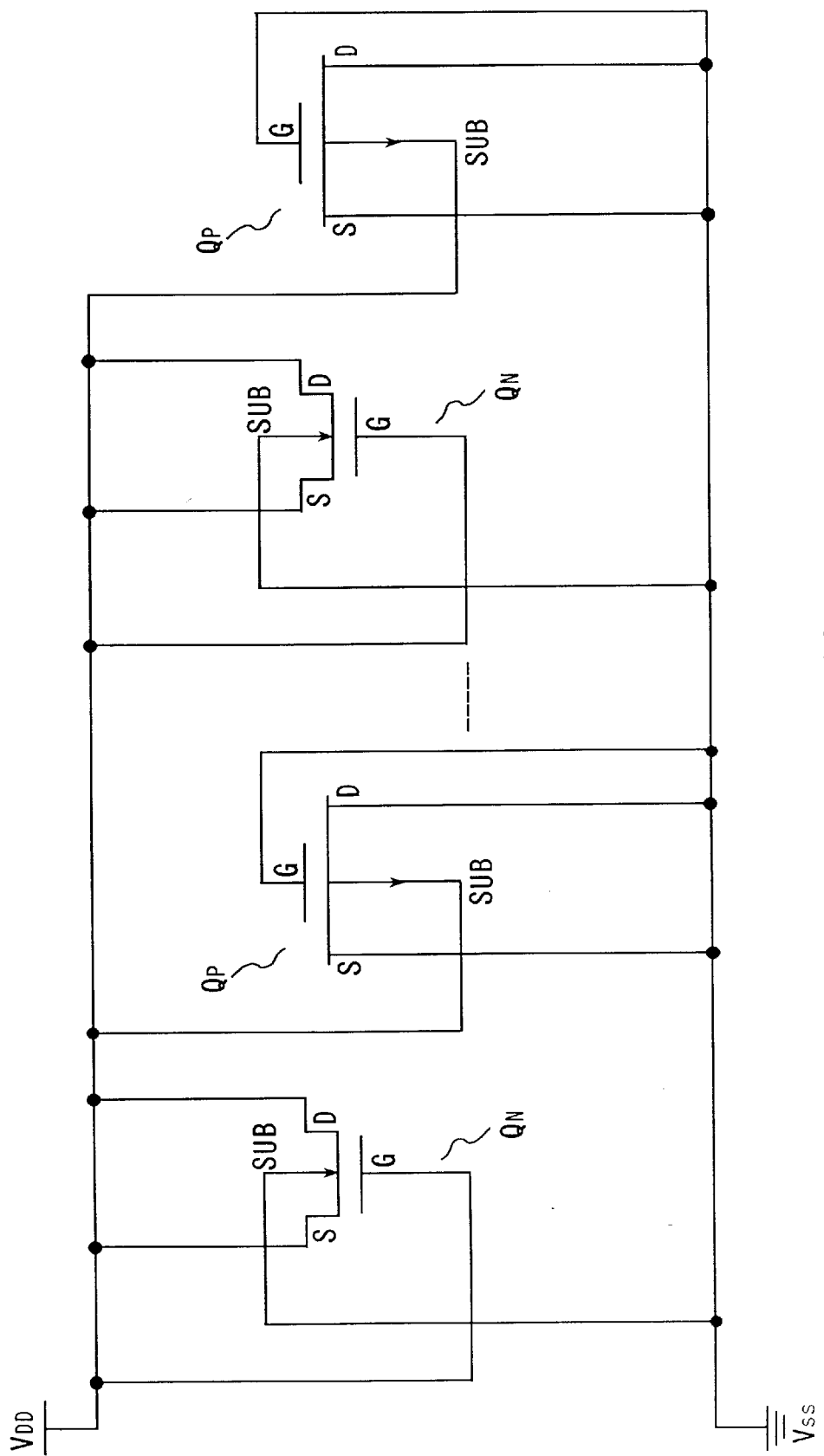
FIG. 10 shows a further example of the circuit of the condenser C10.

FIG. 10 shows a further example of the circuit of the condenser C10. The condenser C10 has a plurality of P-type FET $Q_P$ and a plurality of N-type FET $Q_N$. The power source voltage VDD is applied to the drain D, the source S, and the gate G. The power source voltage VSS is applied to the substrate SUB of the N-type FET $Q_N$ of the condenser C10. The power source voltage VSS is applied to the drain D, the source S, and the gate G, and the power source voltage VDD is applied to the substrate SUB of the P-type FET $Q_P$ of the condenser C10.

Figure 11:
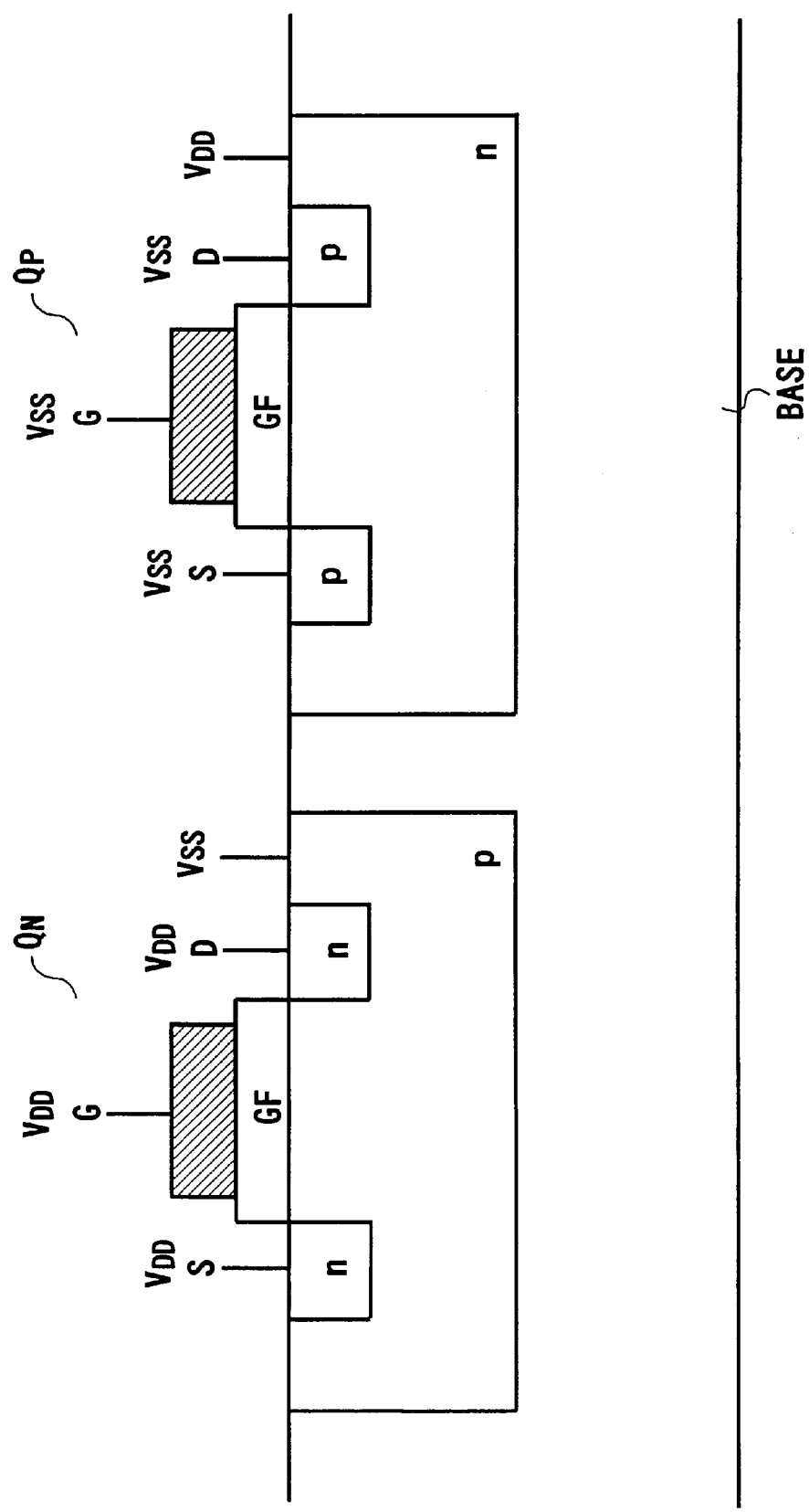
FIG. 11 shows a cross sectional view of the structure of the condenser C10 shown in FIG. 10.

FIG. 11 shows a cross sectional view of the structure of the condenser C10 shown in FIG. 10. The power source voltage VDD, which has a forward bias to the N-type FET $Q_N$, is applied to the gate G of the N-type FET $Q_N$ of the condenser C10. Because the same power source voltage VDD is applied to the source S and the drain D, current does not flow from the source S to the drain D. The power source voltage VSS, which is an opposite power source voltage to that of the source S, the drain D, and gate G, is applied to the substrate SUB. A depletion layer is generated on the surface of the substrate SUB where contact occurs with the gate oxidation film GF. Because this depletion layer functions as an insulator, the condenser C10 can be formed by the FET.

The power source voltage VSS, which has a forward bias to the P-type FET $Q_P$, is applied to the gate G of the P-type FET $Q_P$ of the condenser C10. Because the same power source voltage VSS is applied to the source S and the drain D, current does not flow from the source S to the drain D. The power source voltage VDD, which is an opposite power source voltage to that of the source S, the drain D, and the gate G, is applied to the substrate SUB. A depletion layer is generated on the surface of the substrate SUB where contact occurs with the gate oxidation film GF. Because this depletion layer functions as an insulator, the condenser C10 can be formed by the FET.

Figure 12:
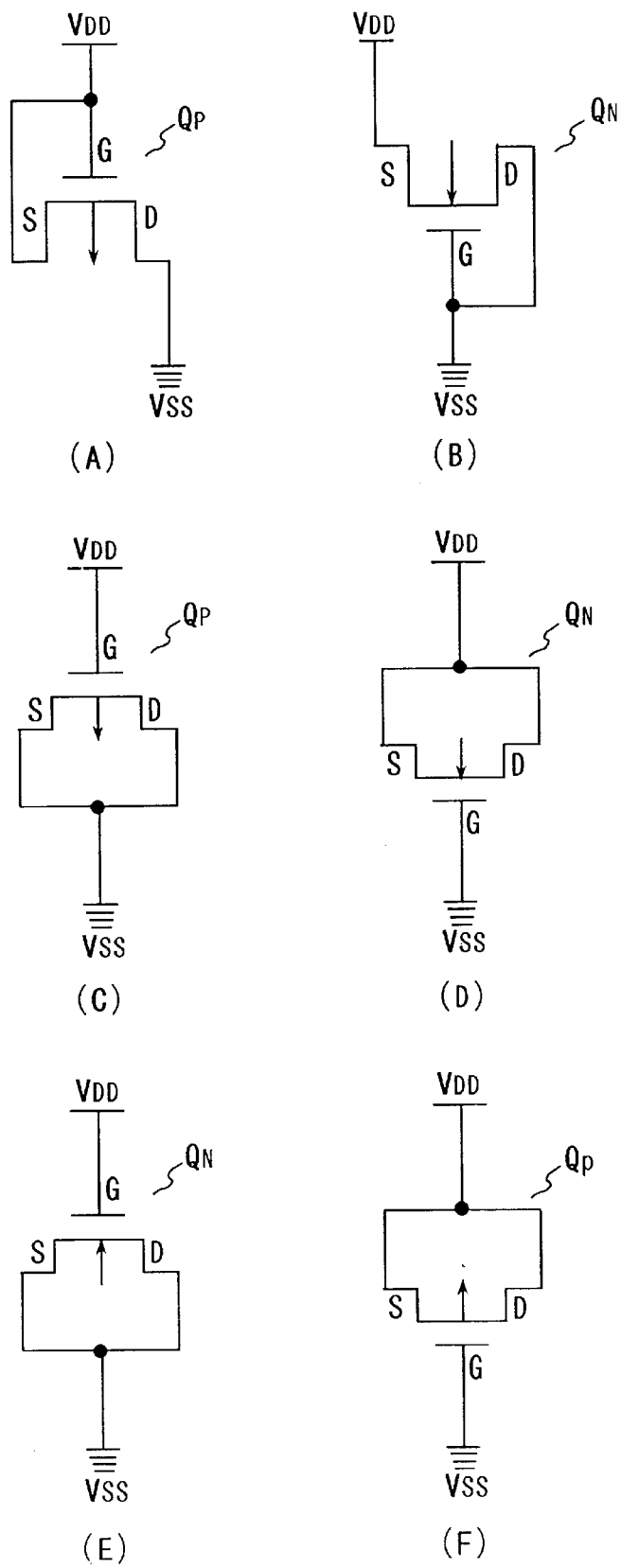
FIG. 12 shows a further example of the circuit of the condenser C10.

FIG. 12 shows a further example of the circuit of the condenser C10. FIG. 12(A) shows an example that uses a P-type FET $Q_P$. In this P-type FET $Q_P$, the power source voltage VDD is applied to the gate G, the source S is connected to the gate G, and the drain D is connected to the power source voltage VSS. FIG. 12(B) shows an example that uses an N-type FET $Q_N$. In this N-type FET $Q_N$, the power source voltage VSS is applied to the gate G, the drain D is connected to the gate G, and the source S is connected to the power source voltage VDD. FIG. 12(C) shows an example that uses a P-type FET $Q_P$. In this P-type FET $Q_P$, the power source voltage VDD is applied to the gate G, and the power source voltage VSS is applied to the drain D and the source S.

FIG. 12(D) shows an example that uses an N-type FET $Q_N$. In this N-type FET $Q_N$, the power source voltage VSS is applied to the gate G, and the power source voltage VDD is applied to the drain D and the source S. FIG. 12(E) shows an example that again uses an N-type FET $Q_N$. In this N-type FET $Q_N$, the power source voltage VDD is applied to the gate G, and the power source voltage VSS is applied to the drain D and the source S. FIG. 12(F) shows an example that uses a P-type FET $Q_P$. In this P-type FET $Q_P$, the power source voltage VSS is applied to the gate G, and the power source voltage VDD is applied to the drain D and the source S.

The gate G of the P-type FET $Q_P$ and the N-type FET $Q_N$, shown in FIGS. 12(A) to (D), is insulated from the substrate SUB and the channel by the gate oxidation film GF. Because the gate oxidation film GF is an insulator, the condenser C10 can be formed by the FET. Forward biased voltage is applied to the gate G of the P-type FET $Q_P$ and the N-type FET $Q_N$ shown in FIGS. 12(E) and (F). Because the same power source voltage VDD or VSS is applied to the source S and the drain D, current does not flow from the source S to the drain D. The power source voltage VDD or VSS, which is an opposite power source voltage to that of the gate G, is applied to the source S and the drain D. A depletion layer is realized on the surface of the substrate SUB where contact occurs with the gate oxidation film GF. Because this depletion layer functions as an insulator, the condenser C10 can be formed by the FET shown in the FIGS. 12(E) and (F). The desired capacity can be obtained by combining the numbers and the arrangement of the P-type FET $Q_P$, and the N-type FET $Q_N$ shown above.

Figure 13:
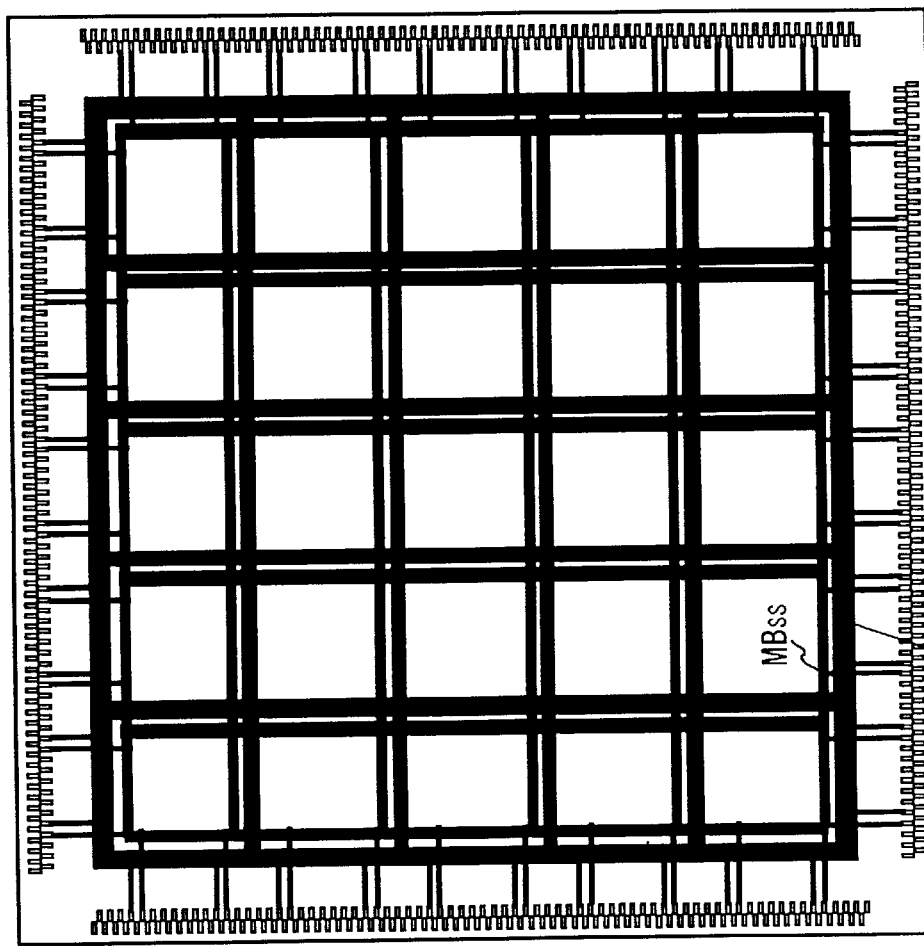
FIG. 13 shows the plan view of the gate array GA of the present invention.

FIG. 13 shows the plan view of the gate array GA of the present invention. The gate array GA has two pairs of main power bus $MB_{DD}$ and $MB_{SS}$ provided at least on the periphery of the gate array GA. The main power bus $MB_{DD}$ and $MB_{SS}$ provide the two power source voltages VDD and VSS (VDD>VSS) to the FET inside the basic cell BC. The main power bus $MB_{DD}$ provides the power source voltage VDD to the FET, and the main power bus $MB_{SS}$ provides the power source voltage VSS to the FET. In the gate array GA shown in FIG. 13, the main power bus $MB_{DD}$ and $MB_{SS}$ are arranged inside the gate array GA in a grid shape. The condenser C10 is provided under the main power bus $MB_{DD}$ and $MB_{SS}$ in this gate array GA. The condenser C10 is provided under the main power bus $MB_{DD}$ and $MB_{SS}$, on the periphery of the gate array GA in the case of the gate array GA having the main power bus $MB_{DD}$ and $MB_{SS}$ on the periphery.

Figure 14:
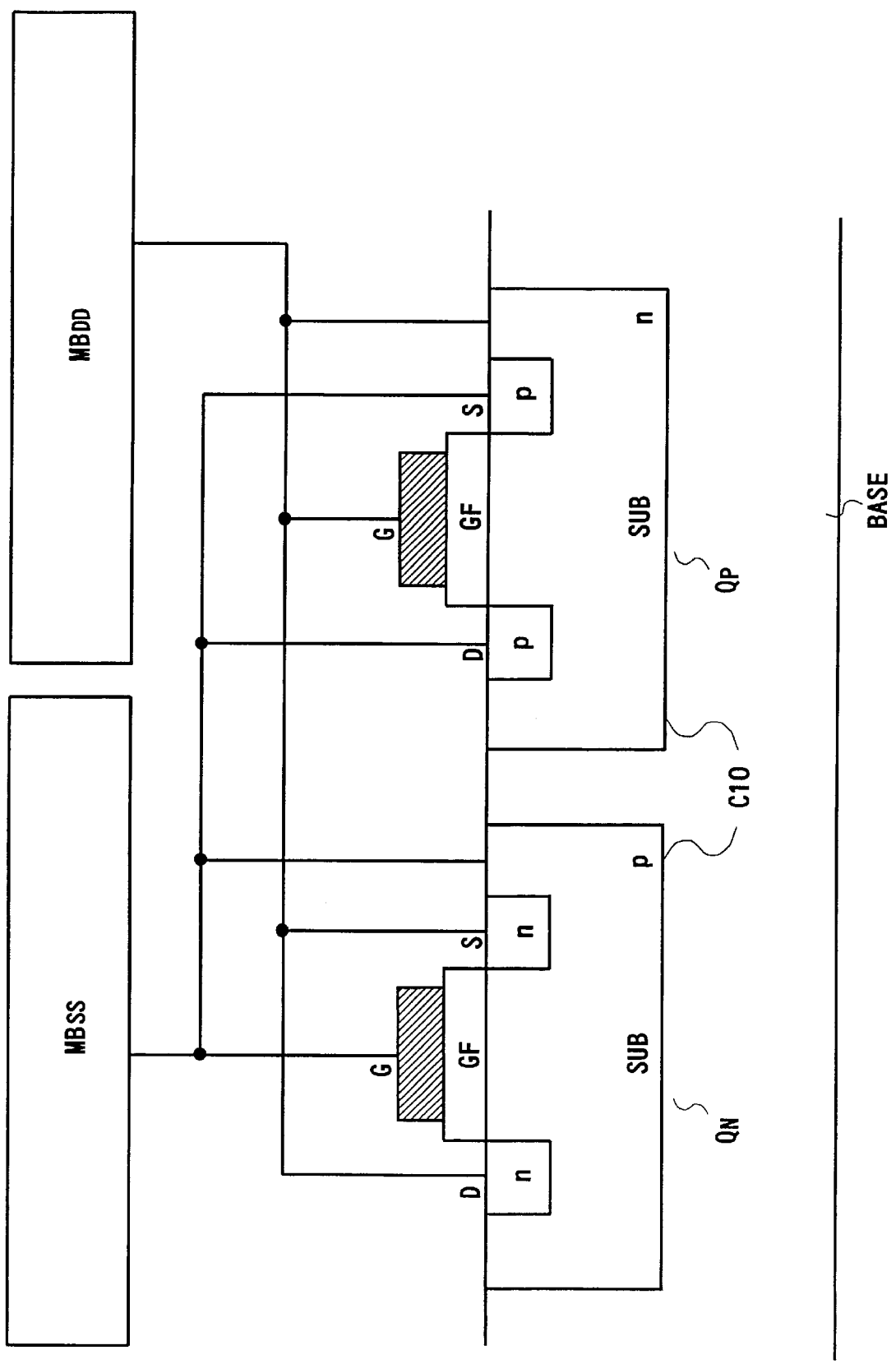
FIG. 14 shows a cross sectional view of the structure of the gate array GA shown in FIG. 13.

FIG. 14 shows the cross sectional view of the structure of the gate array GA shown in FIG. 13. The condenser C10 shown in FIG. 14 has the same structure as the condenser C10 shown in FIGS. 6 and 7. The condenser C10 can have other structures such as the condenser C10 shown in FIGS. 8 to 12 as other embodiments. As the integrated circuit becomes smaller, the number of devices inside the integrated circuit increases. The power source voltage then decreases, and the power source current increases. The width of the main power bus $MB_{DD}$ and $MB_{SS}$ has to be increased to accommodate this increase of the power source currency. Therefore, the ratio of the area occupied by the main power bus $MB_{DD}$ and $MB_{SS}$ to the total area of integrated circuit increases. However, the FET provided under the main power bus $MB_{DD}$ and $MB_{SS}$ is usually not used in the case of a conventional gate array, which has the FET spread across it.

The gate array GA of the present invention uses the P-type FET $Q_P$ and N-type FET $Q_N$ by connecting the P-type FET $Q_P$ and N-type FET $Q_N$, provided between the main power bus $MB_{DD}$ and $MB_{SS}$ and the base, with the main power bus $MB_{DD}$ and $MB_{SS}$.

The P-type FET $Q_P$ and the N-type FET $Q_N$ of the condenser C10 are provided under at least one of the main power bus $MB_{DD}$ and $MB_{SS}$. In other words, the P-type FET $Q_P$ and the N-type FET $Q_N$ are provided between at least one of the main power bus $MB_{DD}$ and $MB_{SS}$ and the base. In the N-type FET $Q_N$ of the condenser C10, the drain D and the source S are connected to the main power bus $MB_{DD}$, and the gate G and the substrate SUB are connected to the main power bus $MB_{SS}$. In the P-type FET $Q_P$ of the condenser C10, the drain D and the source S are connected to the main power bus $MB_{SS}$, and the gate G and the substrate SUB are connected to the main power bus $MB_{DD}$.

A capacity coupling is formed between the main power bus $MB_{DD}$ and $MB_{SS}$ by connecting the main power bus $MB_{DD}$ and $MB_{SS}$ with the P-type FET $Q_P$ and the N-type FET $Q_N$ of the condenser C10 as shown above. By forming the capacity coupling, the current consumed by charging and discharging the wiring capacitance CL of the main power bus $MB_{DD}$ and $MB_{SS}$ is supplemented with the capacity coupling. Therefore, the fluctuation of the power source voltage VDD and VSS of the main power bus $MB_{DD}$ and $MB_{SS}$ can be reduced. The power source noise generated during the operation of the FET decreases, and the malfunction caused by the power source noise decreases.

Furthermore, the components of the inductance contained in the main power bus $MB_{DD}$ and $MB_{SS}$ can be decreased by providing the condenser C10 between the main power bus $MB_{DD}$ and the main power bus $MB_{SS}$, therefore also decreasing the high frequency impedance.

Figure 15:
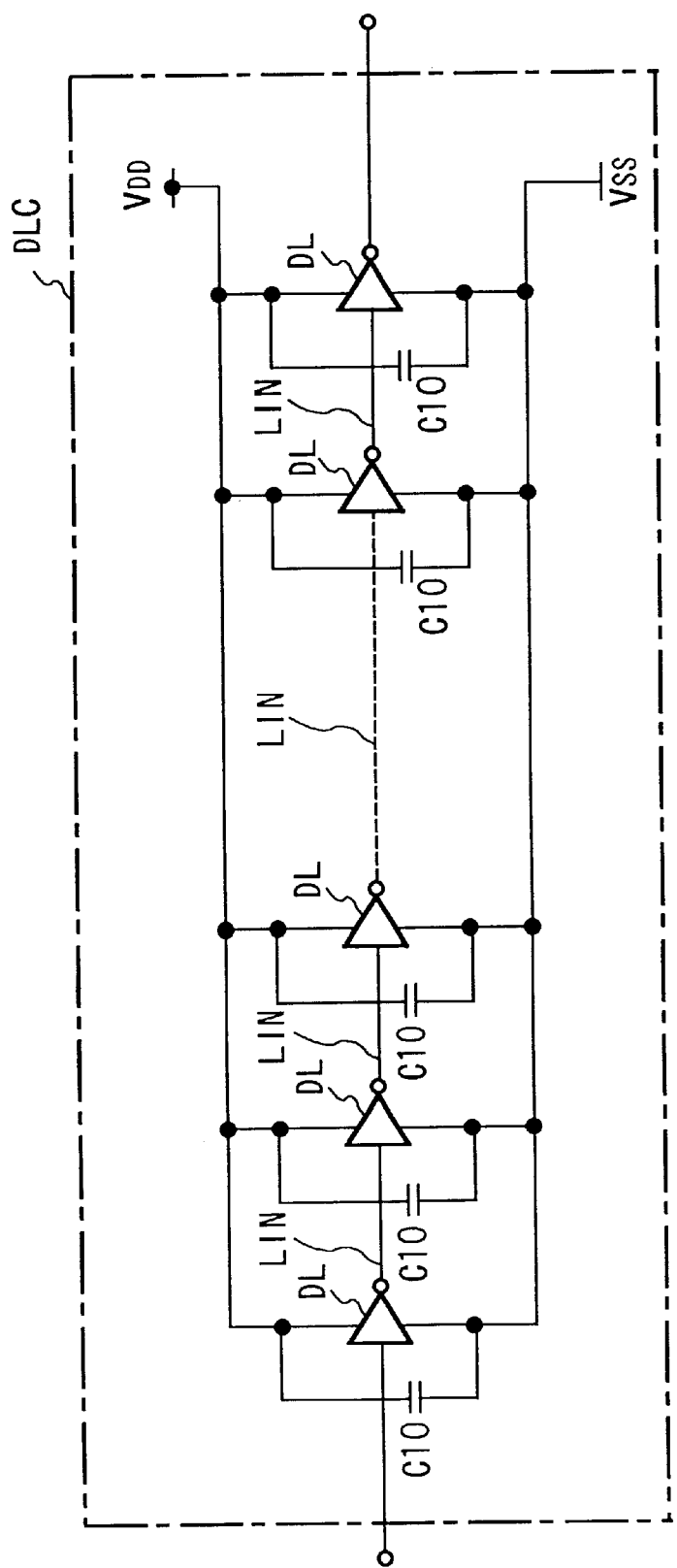
FIG. 15 shows a delay circuit DLC of the present embodiment that uses the condenser C10.

FIG. 15 shows a delay circuit DLC of the present embodiment that uses the condenser C10. The delay circuit DLC has a plurality of delay devices DL connected in series, and a signal line LIN, which connects each of the delay devices DL. A plurality of the condensers C10 connect the power source voltage VDD and VSS beside each of the delay devices DL. The delay device DL and the condenser C10 are formed by the FET inside the basic cell BC. During the delay of an input signal by the delay device DL, the power source current Ih and Il flow between each of the delay device DL.

Because the wiring capacitance CL is generated on the signal line LIN, the electric charge of the power source current Ih and Il are charged and discharged in the wiring capacitance CL, and thus the power source voltage VDD and VSS fluctuates. By connecting the power source voltage VDD and VSS with the condenser C10 beside each of the delay device DL, the currents consumed by the wiring capacitance CL is supplemented by the condenser C10. Therefore, condenser C10 decreases the change in the power source current Ih and Il, and decreases the fluctuation of the power source voltage VDD and VSS. This therefore increases the accuracy of the delay time of the delay circuit DLC.

Figure 16:
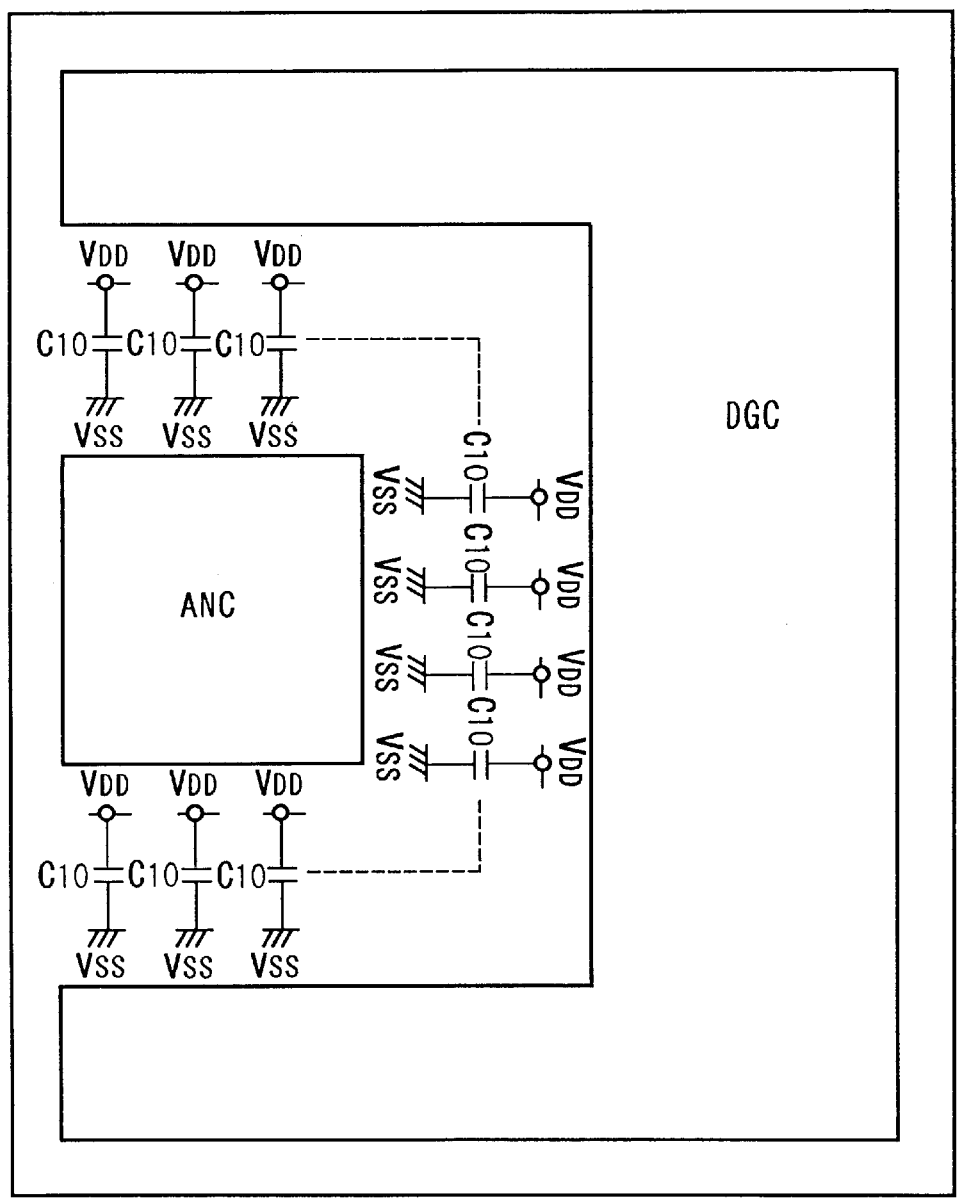
FIG. 16 shows a gate array GA of the present embodiment that has a plurality of condensers C10 arranged between an analog circuit unit ANC and a digital circuit unit DGC.

FIG. 16 shows a gate array GA of the present embodiment that has a plurality of condensers C10 arranged between an analog circuit unit ANC and a digital circuit unit DGC. The gate array GA comprises an analog circuit unit ANC and a digital circuit unit DGC. The condenser C10 is arranged between the analog circuit unit ANC and the digital circuit unit DGC. The analog circuit unit ANC, digital circuit unit DGC, and the condenser C10 are formed by the FET inside the basic cell BC. The condenser C10 shown in the FIGS. 6 to FIG. 12 can be used for the condenser C10 shown in the FIG. 16.

The analog circuit unit ANC and the digital circuit unit DGC are driven by the two power source voltages VDD and VSS (VDD>VSS). The condenser C10 forms a capacity coupling between the power source voltage VDD and the power source voltage VSS. Because the analog circuit unit ANC is sensitive to small changes in the signal, the signal generated by the analog circuit unit ANC distorts when the fluctuation of the power source voltage VDD and VSS is increased by the digital circuit unit DGC. By providing the condenser C10 between the analog circuit unit ANC and the digital circuit unit DGC, the power source currents Ih and Il, which are consumed by the digital circuit unit DGC, are supplemented by the condenser C10. Thus the fluctuation of the power source voltage VDD and VSS decreases. Therefore, the distortion of the signal generated by the analog circuit unit ANC decrease.

Although the present invention has been described with reference to specific embodiments, the scope of the present invention is not limited to these embodiments. Those skilled in the art can make various modifications and improvements to these embodiments of the present invention. It is clear from the appended claims that such modifications or improvements are also covered by the scope of the present invention.

What is claimed is:

1. A semiconductor device driven by two power source voltages VDD and VSS (VDD>VSS) comprising:
    a base;
    a plurality of electric circuits, each of which is provided with two power source voltages VDD and VSS, respectively;
    at least one FET provided on said base connecting in parallel with each of said electric circuits, said FET having a gate, a source, a drain, and a substrate; and
    said gate is connected to one of said two power source voltages VDD and VSS of a corresponding electric circuit, and at least one of said source, said drain, or said substrate is connected to another of said two power source voltages VDD and VSS of said corresponding electric circuit, and
    a capacity coupling is formed between said power source voltage VDD and said power source voltage VSS of each of said electric circuits by a capacitance realized between said gate and at least one of said source, said drain, and said substrate to compensate a fluctuation of said power source voltages VDD and VSS for each of said electric circuits.

2. A semiconductor device as claimed in claim 1, further comprising:
    a main power bus provided at least on a periphery of said semiconductor device which provides said two power source voltages VDD and VSS to said FET, and
    said FET is provided between said base and said main power bus, and
    said capacity coupling is formed between said power source voltage VDD and said power source voltage VSS of said main power bus by said FET to compensate a fluctuation of said power source voltages VDD and VSS for each of said electric circuits.

3. A semiconductor device as claimed in claim 1, wherein said FET is an N-type FET, and
    said power source voltage VDD is applied to said drain and said source of said N-type FET, and
    said power source voltage VSS is applied to said gate and said substrate of said N-type FET.

4. A semiconductor device as claimed in claim 1, wherein said FET is a P-type FET, and
    said power source voltage VSS is applied to said drain and said source of said P-type FET, and
    said power source voltage VDD is applied to said gate and said substrate of said P-type FET.

5. A semiconductor device as claimed in claim 1, wherein said FET is an N-type FET, and
    said power source voltage VSS is applied to said drain, said source, and said substrate of said N-type FET, and
    said power source voltage VDD is applied to said gate of said N-type FET.

6. A semiconductor device as claimed in claim 1, wherein said FET is a P-type FET, and
    said power source voltage VDD is applied to said drain, said source, and said substrate of said P-type FET, and
    said power source voltage VSS is applied to said gate of said P-type FET.

7. A semiconductor device as claimed in claim 1, wherein said FET is an N-type FET, and
    said power source voltage VDD is applied to said drain, said source, and said gate of said N-type FET, and
    said power source voltage VSS is applied to said substrate of said N-type FET.

8. A semiconductor device as claimed in claim 1, wherein said FET is a P-type FET, and
    said power source voltage VSS is applied to said drain, said source, and said gate of said P-type FET, and
    said power source voltage VDD is applied to said substrate of said P-type FET.

9. A semiconductor device as claimed in claim 1, wherein
said FET is a P-type FET, and
said power source voltage VDD is applied to said gate of said P-type FET, and
at least one of said drain and said source of said P-type FET is connected to said gate, and another one of said drain and said source is connected to said power source voltage VSS.

10. A semiconductor device as claimed in claim 1, wherein
said FET is an N-type FET, and
said power source voltage VSS is applied to said gate of said N-type FET, and
at least one of said drain and said source of said N-type FET is connected to said gate, and another one of said drain and said source is connected to said power source voltage VDD.

11. A semiconductor device as claimed in claim 1, wherein
said FET is a P-type FET, and
one of said power source voltage VDD and said power source voltage VSS is applied to said gate of said P-type FET, and
another one of said power source voltage VDD and said power source voltage VSS is applied to said drain and said source of said P-type FET.

12. A semiconductor device as claimed in claim 1, wherein
said FET is an N-type FET, and
one of said power source voltage VDD and said power source voltage VSS is applied to said gate of said N-type FET, and
another one of said said power source voltage VDD and said power source voltage VSS is applied to said drain and said source of said N-type FET.

13. A semiconductor device as claimed in claim 1, wherein
said semiconductor device is a gate array which has a plurality of arranged FET, and
said capacity coupling is formed by said FET of said gate array.

14. A semiconductor device as claimed in claim 1, wherein
said plurality of electric circuits is:
an analog circuit unit driven by said two power source voltages VDD and VSS (VDD>VSS); and
a digital circuit unit driven by said two power source voltage sources VDD and VSS (VDD>VSS), and
said FET is provided between said analog circuit unit and said digital circuit unit to compensate a fluctuation of said power source voltage VDD and VSS of said digital circuit unit.

15. A semiconductor device as claimed in claim 14, wherein at least one of said analog circuit unit and said digital circuit unit has said FET.

16. A semiconductor device as claimed in claim 1, wherein
said plurality of electric circuits is:
an input circuit which inputs a signal from outside said semiconductor device; and
an output circuit which outputs a signal to outside of said semiconductor device, and
at least one of said FET is connected in parallel with said input circuit, the other said FET is connected in parallel with said output circuit to compensate a fluctuation of said power source voltages VDD and VSS for each of said input circuit and output circuit.

17. A semiconductor device as claimed in claim 1, wherein
said plurality of electric circuits is:
a plurality of delay devices which delay an input signal, said delay devices being driven by said two power source voltages VDD and VSS (VDD>VSS); and
a plurality of said FET, each of which is connected in parallel with a different said delay device, and
said capacity coupling is formed between said power source voltage VDD and said power source voltage VSS by each of said plurality of said FET to compensate a fluctuation of said power source voltage VDD and VSS for each of said delay devices.

18. A semiconductor device driven by two power source voltages VDD and VSS (VDD>VSS) comprising:
a plurality of electric circuits, which are connected to each other electrically, and each of which are applied with two power source voltages VDD and VSS, respectively; and
at least one capacitor provided connecting in parallel with each of said electric circuits to compensate a fluctuation of said power source voltage VDD and VSS of each of said electric circuits.

* * * * *